US008519807B2

(12) United States Patent
Luo et al.

(10) Patent No.: US 8,519,807 B2
(45) Date of Patent: Aug. 27, 2013

(54) TUNER CIRCUIT WITH LOOP THROUGH FUNCTION

(75) Inventors: Zhi Qing Luo, Singapore (SG); Tiam Fatt Tey, Singapore (SG)

(73) Assignee: Thomson Licensing, Boulogne-Billancourt (FR)

( * ) Notice: Subject to any disclaimer, the term of this patent is extended or adjusted under 35 U.S.C. 154(b) by 826 days.

(21) Appl. No.: 12/452,424

(22) PCT Filed: Jun. 23, 2008

(86) PCT No.: PCT/EP2008/057950
§ 371 (c)(1),
(2), (4) Date: Dec. 29, 2009

(87) PCT Pub. No.: WO2009/003863
PCT Pub. Date: Jan. 8, 2009

(65) Prior Publication Data
US 2010/0134219 A1 Jun. 3, 2010

(30) Foreign Application Priority Data
Jun. 29, 2007 (EP) .................................... 07301192

(51) Int. Cl.
*H03H 5/12* (2006.01)
(52) U.S. Cl.
USPC .......................................................... 334/15

(58) Field of Classification Search
USPC ..................................... 334/15; 348/725, 731
See application file for complete search history.

(56) References Cited

U.S. PATENT DOCUMENTS
5,978,049 A  11/1999  Ruitenburg

FOREIGN PATENT DOCUMENTS
| EP | 0679025 | 10/1995 |
| EP | 0769850 | 4/1997 |
| WO | WO 99/55085 | 10/1999 |
| WO | WO 03/071680 | 8/2003 |

OTHER PUBLICATIONS
Search Report Dated Nov. 17, 2008.

*Primary Examiner* — Robert Pascal
*Assistant Examiner* — Kimberly Glenn
(74) *Attorney, Agent, or Firm* — Tutunjian & Bitetto, P.C.

(57) ABSTRACT

The tuner circuit comprises a HF input and a HF output with a loop through function, wherein a variable capacitance diode is coupled with a first terminal to the HF input and with a second terminal to the HF output for providing a passive loop through function. The variable capacitance diode is in particular in a passing mode, when no DC reverse voltage is applied, for providing a passive loop through function. In a preferred embodiment, the tuner circuit is designed for reception of television channels, and for the variable capacitance diode one or two tuning variable capacitance diode is used being designed for satellite tuners with a frequency range of 1-2 GHz, or a specially designed variable capacitance diode with a capacitance ratio $C_1/C_{25}>18$ at a frequency of 1 MHz for DC reverse voltages of 1 and 25 Volts is used.

14 Claims, 3 Drawing Sheets

TUNER CIRCUIT WITH LOOP THROUGH FUNCTION

This application claims the benefit, under 35 U.S.C. §365 of International Application PCT/EP2008/057950, filed Jun. 23, 2008, which was published in accordance with PCT Article 21(2) on Jan. 8, 2009 in English and which claims the benefit of European patent application No. 07301192.6, filed Jun. 29, 2007.

FIELD OF THE INVENTION

The present invention relates to a tuner circuit comprising a HF input and a HF output with a loop through function for coupling a HF input signal to the HF output. The tuner circuit is in particular adapted for a reception of television channels.

BACKGROUND

For TV tuners included in television receivers tuner circuits are often used having a loop through function for passing the HF input signal, for example an antenna signal, to a HF output, so that the input signal can be used also for a second television receiver or for a video recorder. To the HF output also the output signal of a TV modulator may be coupled, to provide for the subsequent appliance the baseband signal of the television program, as selected by the television receiver. A tuner circuit comprising an active amplifier for the loop through function is known for example from EP 769850.

The loop through function should operate also, when the television receiver is switched-off, to allow the operation of the subsequent television receiver or the video recorder also in the case, when the first television receiver is switched-off. Due to energy saving, it is advantageous that the power consumption of the loop through function is zero or as small as possible, when the tuner circuit and the respective television set are switched-off.

A loop through function not requiring any power when the tuner is switched-off is possible when using a MOSFET circuit including a depletion type MOSFET. This type of MOSFET is switched-through when the supply voltages at the MOSFET are zero. The depletion type MOSFET is blocking, if the gate-source voltage has a sufficiently negative value.

To provide a low insertion loss when the MOSFET is switched-through and a sufficiently high isolation when the MOSFET is blocking over a bandwidth of about 50 MHz to 800 MHz, as required for television tuners, specially designed MOSFETs have to be used, for the example the RF switch BF1107 provided by Philips Semiconductors. Technical details and applications for this RF switch can be found in the Philips RF Manual, $3^{rd}$ edition, Appendix D, July 2003, pages 40-45, document number 432225206385.

BRIEF SUMMARY OF THE INVENTION

The tuner circuit according to the invention comprises a HF input and a HF output and a loop through function, which is realized by including a variable capacitance diode coupled between the HF input and the HF output. The variable capacitance diode is advantageously selected such, that the diode is in a blocking mode, when a DC voltage, in particular a DC reverse voltage, is applied, and in a passing mode, when a low or no DC voltage is applied. A passive loop through function can be realized therefore with zero energy consumption, when the tuner circuit is switched off, therefore reducing circuit parts costs and space requirement with regard to a MOSFET solution.

For applications within a television tuner, advantageously a tuning variable capacitance diode can be used for the variable capacitance diode being designed for satellite tuners with a frequency range of 1-2 GHz. In a preferred embodiment, the tuner circuit is designed for reception of television channels with a frequency range of about 110-858 MHz, and one tuning variable capacitance diode designed for satellite tuners with a frequency range of 1 GHz-2 GHz is used for the passive loop through function. In another preferred embodiment, the tuner circuit is designed for reception of television channels with a frequency range of about 48-858 MHz, and two tuning variable capacitance diodes of this type are arranged in parallel.

In a further aspect of the invention, a specially designed variable capacitance diode is used, to cover with only one diode the complete frequency range of 48 MHz to 858 MHz. A selected variable capacitance diode has for example a capacity $C_1>16$ pF, in particular $C_1>18$ pF, when a DC reverse voltage<1 V is applied, providing sufficiently low losses for the frequency range of 48 to 860 MHz, and a capacity $C_{25}<1$ pF, in particular $C_{25}<0.7$ pF, when a DC reverse voltage>25 V is applied, providing sufficient isolation to not disturb an additionally provided active loop through function. A selected variable capacitance diode of this kind provides in particular a capacitance ratio $C_1/C_{25}>18$ at a frequency of 1 MHz for DC reverse voltages of 1 and 25 Volts.

For the DC reverse voltage advantageously a 33 V supply voltage already available as a tuning voltage in the tuner circuit can be utilized.

BRIEF DESCRIPTION OF THE DRAWINGS

Preferred embodiments of the invention are explained in more detail below by way of example with reference to schematic drawings, which show.

DETAILED DESCRIPTION OF PREFERRED EMBODIMENTS

Figure 1:
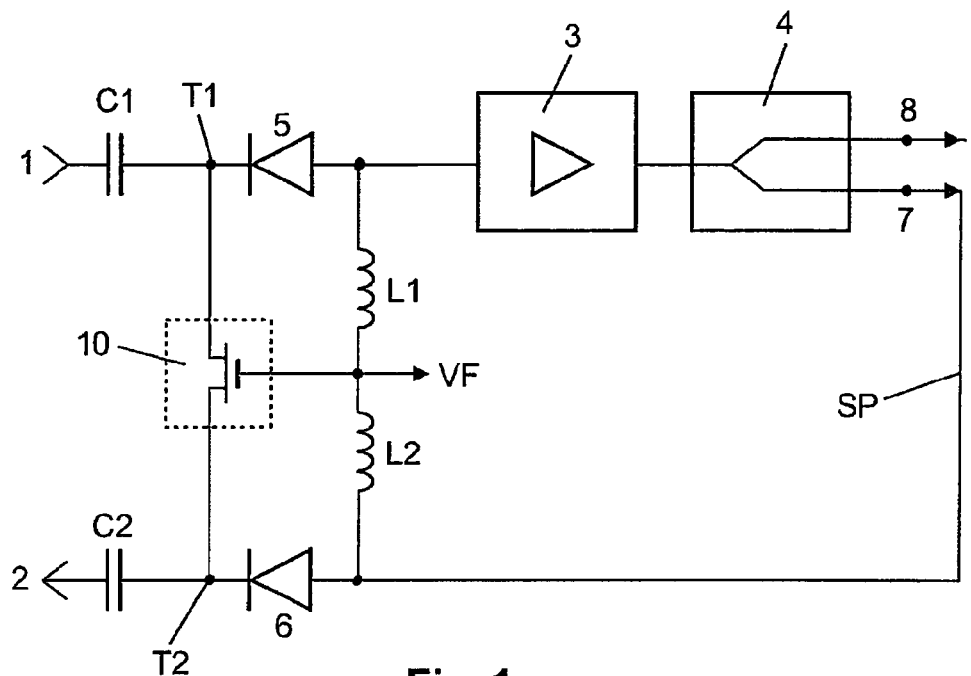
FIG. 1 an input stage of a tuner circuit according to prior art utilizing a FET switch for a passive loop through function, FIG. 2 an input stage of a tuner circuit according to the invention comprising a variable capacitance diode for a passive loop through function, FIG. 3 an equivalent circuit for the tuner circuit of FIG. 2, when the tuner circuit is switched on, FIG. 4 an equivalent circuit for the tuner circuit of FIG. 2, when the tuner circuit is switched off, FIG. 5 a photo showing a FET switch according to prior art and a variable capacitance diode according to the invention, and FIG. 6 an input stage of a tuner circuit comprising a variable capacitance diode for application as a television tuner.

In FIG. 1 an input stage of a tuner circuit according to prior art is shown comprising a HF input 1 coupled to an input of an amplifier stage 3 via a DC blocking capacitor C1 and a switching diode 5, e.g. a band-switching diode BA892. The amplifier stage 3 provides an amplified HF signal, which is coupled by means of a power splitter 4 to subsequent circuits of the tuner circuit and in addition via a signal path SP, a second switching diode 6 and a DC blocking capacitor C2 to a HF output 2. The switching diodes 5, 6, the amplifier stage 3 as well as the other circuit parts of FIG. 1 are designed in particular for reception of television channels having a frequency bandwidth of e.g. 48 MHz-858 MHz. Tuner circuits of this kind are used for example in television sets and video recorders.

The signal path SP coupling the HF signal from the power splitter 4 to the HF output 2 is a so-called "active loop through" which is only operating when the tuner circuit is switched on, and in which both switching diodes 5, 6 are forward biased to allow passing of the HF signal. The switching diodes 5, 6 are therefore acting in the on-mode as very small resistances providing only little attenuation.

The tuner circuit comprises in addition a so-called "passive loop through" with a FET switch 10, which is coupled with a current input to a node T1 arranged between capacitor C1 and switching diode 5 and with a current output to a node T2 arranged between capacitor C2 and diode 6. The gate of the FET switch 10 is coupled to a control circuit, not shown, providing a DC control voltage VF for the operation of the switch 10. The control circuit provides also control voltages for the switching diodes 5, 6 via coils L1, L2, as indicated. The provision of the control voltages for diodes 5, 6 and switch 10 is shown in a simplified manner for illustrating only the principle of the operation of the tuner circuit.

The operation of the tuner circuit is as follows: when the tuner circuit is in on-mode, amplifier stage 3 and power splitter 4 are operating and the switching diodes 5, 6 are switched through by means of control voltage VF, to allow passing of the HF signals. The power splitter 4 provides therefore HF signals as received at signal input 1 at its first output 7 via signal pass SP, diode 6 and capacitor C2 for the HF output 2 and at its second output 8 for subsequent tuner stages. The HF output 2 can be used therefore for the operation of a second television set or for a video recorder.

The HF signal at input 1 should be coupled in particular also to the HF output 2, when the respective appliance, in which the tuner circuit is arranged, is switched off, for example to allow timer recordings for a video recorder coupled to the HF output 2. But the signal pass SP is only operating, when amplifier stage 3 and power splitter 4 are operating. The appliance may provide therefore a standby mode, in which the tuner circuit is always operating. But this leads to an unwanted energy consumption and may not be acceptable for a user.

To provide a coupling of the HF input signal at input 1 to HF output 2 also when the tuner circuit is switched off, the passive loop through function is included. The FET switch 10 is for example a depletion type MOSFET and is selected such, that the MOSFET is switched on if the supply voltage VF at the gate is zero. The switching diodes 5, 6 are then blocking, because no control voltage is applied. The HF input signal is therefore coupled via FET switch 10 to the HF output 2 with only little losses, determined essentially by the $R_{DS\,on}$ resistance and drain-gate and source-gate capacitances of FET switch 10.

For the FET switch 10 for example the MOSFET BF1107 from Phillips Semiconductors can be used, which is specially designed for the passive loop through function in television tuners. Respective circuit applications can be found in appendix d of the RF Manual. When the tuner circuit is switched on, the FET switch 10 is blocked via control voltage VF, to not disturb the active loop through function via signal pass SP.

The active loop through function has the advantage, that the HF input signal is amplified by the amplifier stage 3 and is applied to the HF output 2 without losses via signal pass SP, and has therefore a slightly better noise performance than the passive loop through function via FET switch 10.

Figure 2:
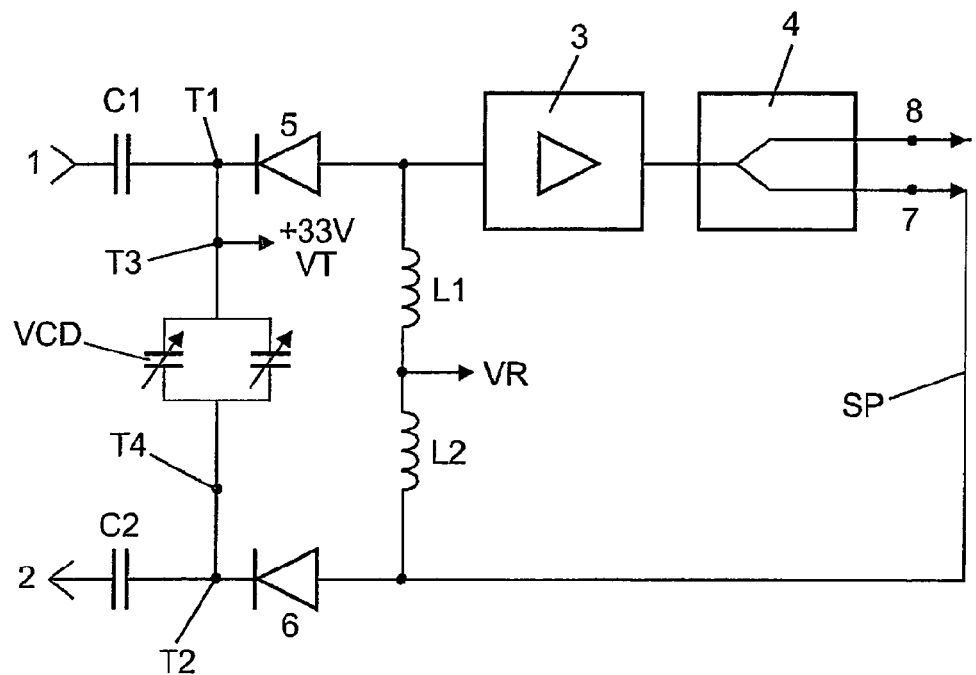

In FIG. 2 an input stage of a tuner circuit according to the invention is shown comprising two variable capacitance diodes VCD, also known as varicaps, for the passive loop through function. The varicaps VCD are both coupled with a first terminal T3 to node T1 and with a second terminal T4 to node T2. Both varicaps are coupled in parallel. For a control of the varicaps, a control circuit, not shown, is coupled to terminal T3 for providing a switchable DC reverse voltage VT. The control circuit provides also a control voltage VR for the switching diodes 5, 6 via coils L1, L2, as indicated. The other circuit elements 3-6 of the tuner circuit of FIG. 2 correspond with the respective circuit elements as shown in FIG. 1. Also the active loop through function with signal path SP coupling the HF signals from a first output 7 of the power splitter 4 to the HF output 2 operates as explained before.

For the operation of the control circuit, in particular the 33 V supply already available in television tuners can be advantageously used. The varicaps are selected such, that they have a large capacitance, when no or only little reverse voltage VT is applied, providing therefore a low impedance for HF input signals, and exhibit a small capacitance to provide a high impedance for HF input signals, when a high reverse voltage VT is applied at terminal T3.

Therefore, when the tuner circuit is in off-mode, no voltage is applied to terminal T3, and therefore the varicaps allow passing of HF input signals from HF input 1 to HF output 2, for providing the passive loop through function. When the tuner circuit is in on-mode, reverse voltage VT is applied to terminal T3 to switch both Varicaps to a blocking mode. Then the active loop through function via signal pass SP is operating, as described with regard to FIG. 1. In the on-mode, the switching diodes 5, 6 are switched through via control voltage VR applied via coils L, L2 and the amplifier stage 3 and power splitter 4 are operating, as described already before.

For the varicaps VCD of the tuner circuit in particular tuning varicaps as used in satellite tuners for the frequency range 1 GHz-2 GHz can be utilised, which exhibit appropriate characteristics for an application within the tuner circuit of FIG. 2. Satellite tuner varicaps can be found which have a capacity of 0.5 pF, when a sufficiently high reverse voltage is applied and a capacity of 8 pF, when the reverse voltage is zero or below 1 V. The capacity of 0.5 pF would provide a sufficient isolation, when the tuner circuit is switched on, to disable the passive loop through function. The capacity 8 pF is sufficient to allow passing of frequencies of above 100 MHz with acceptably low insertion loss, but is critical for frequencies below 100 MHz. The tuner circuit with a single varicap of this kind provides therefore adequate performance for a frequency range of 110 MHz-858 MHz, which is the required frequency range of digital television receivers for the Chinese market.

If two varicaps of this kind are used in parallel for the passive loop through function, the capacitance for the power off mode is 16 pF and for the power on mode 1 pF. This provides an improved performance for the frequency range of 48 MHz-858 MHz for the passive loop through function. Only the isolation in the upper frequency range is critical, when both Varicaps are in blocking mode, but may still be acceptable.

Figure 3:
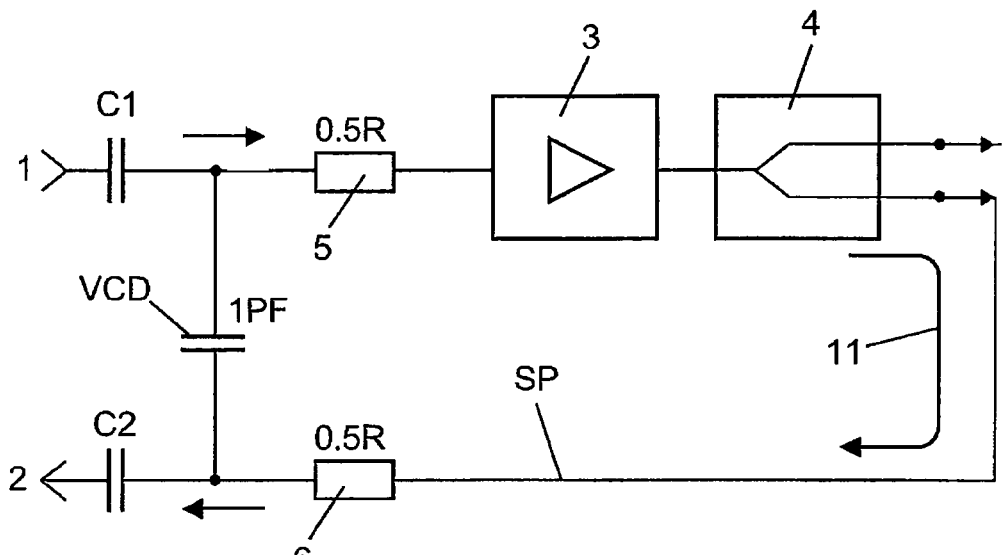
Figure 4:
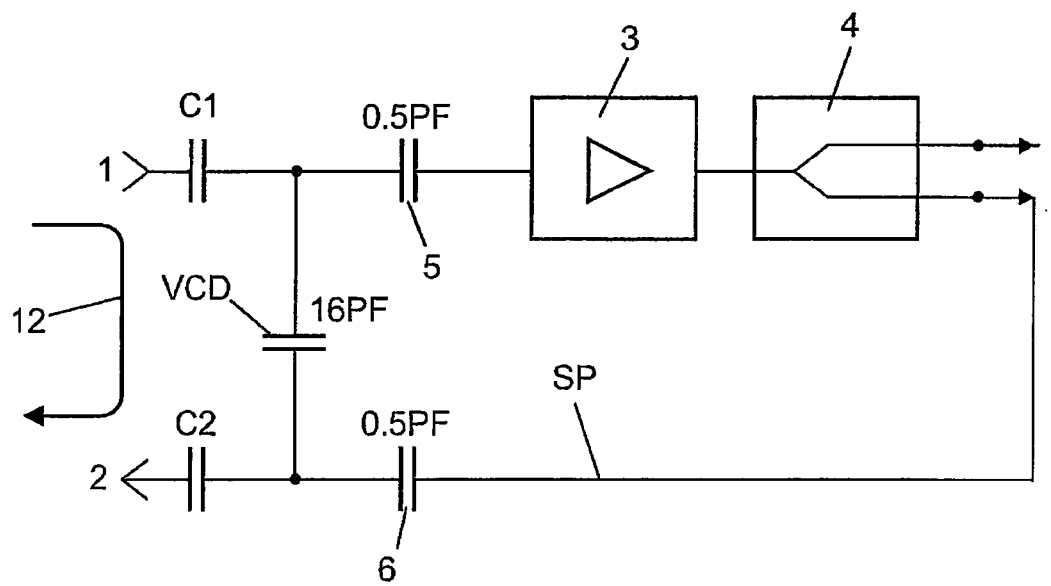

For the application with two varicaps VCD, respective equivalent circuits of the input stage of the tuner circuit are shown in FIG. 3 for power on mode and in FIG. 4 for power off mode. In the on mode the active loop through function via signal pass SP is operating, signal flow 11. The switching diodes 5, 6 are then forward biased by means of the control voltage VR and provide a resistance of about 0.5 Ohm for HF input signals, as received at HF input 1. The varicaps exhibit a total capacitance of 1 pF for providing isolation between the HF input 1 and HF output 2, because of the applied reverse voltage VT.

The equivalent circuit for the tuner circuit when in power off mode is shown in FIG. 4. The switching diodes 5, 6 have then a capacity of 0.5 pF each which disables the signal pass SP of the active loop through function. Both Varicaps exhibit in this mode a capacity of 16 pF, which allows passing of HF signals from HF input 1 to HF output 2 in the frequency range of 48 MHz-860 MHz with only little attenuation, signal flow 12.

In the meanwhile, variable capacitance diodes are available on request, for example the type 1W419 of the company TWPEC, which is ideally suited for application for the varicap VCD of the passive loop through function. This Varicap exhibits a capacity above 18 pF at a frequency of 1 MHz for a reverse voltage of 0.1 V or below, and a capacity below 0.7 pF, typically 0.57 pF, already for a reverse voltage of 25 V at a frequency of 1 MHz. The typical capacitance ratio $C_1/C_{25}$ (1V/25V) is 21.7, minimum 18.0, for frequencies of 1 MHz. A single varicap of this type provides therefore sufficiently low insertion loss for the passive loop through function and a sufficient isolation in the power-on mode for application in television tuners with a frequency range of 48 MHz-858 MHz. Also a varicap from the company Reneas is now available, RKV552, which is usable for the passive loop through function for application in television tuner circuits.

Figure 5:
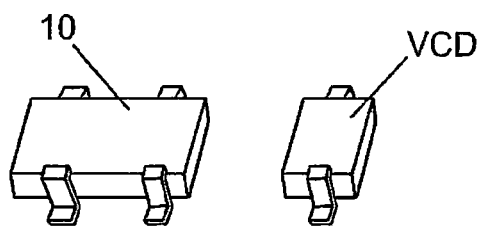

A varicap VCD of this type is much smaller than a FET switch 10, as shown in FIG. 5. Displayed is the FET switch BF1108 from the company NXP, which is designed for the passive loop through function of a television tuner. The area of the printed circuit board of an already small TV tuner can be considerably reduced therefore. Also, a cost reduction of about 13 US cent is obtained with regard to a tuner circuit using a FET switch as shown in FIG. 1.

Figure 6:
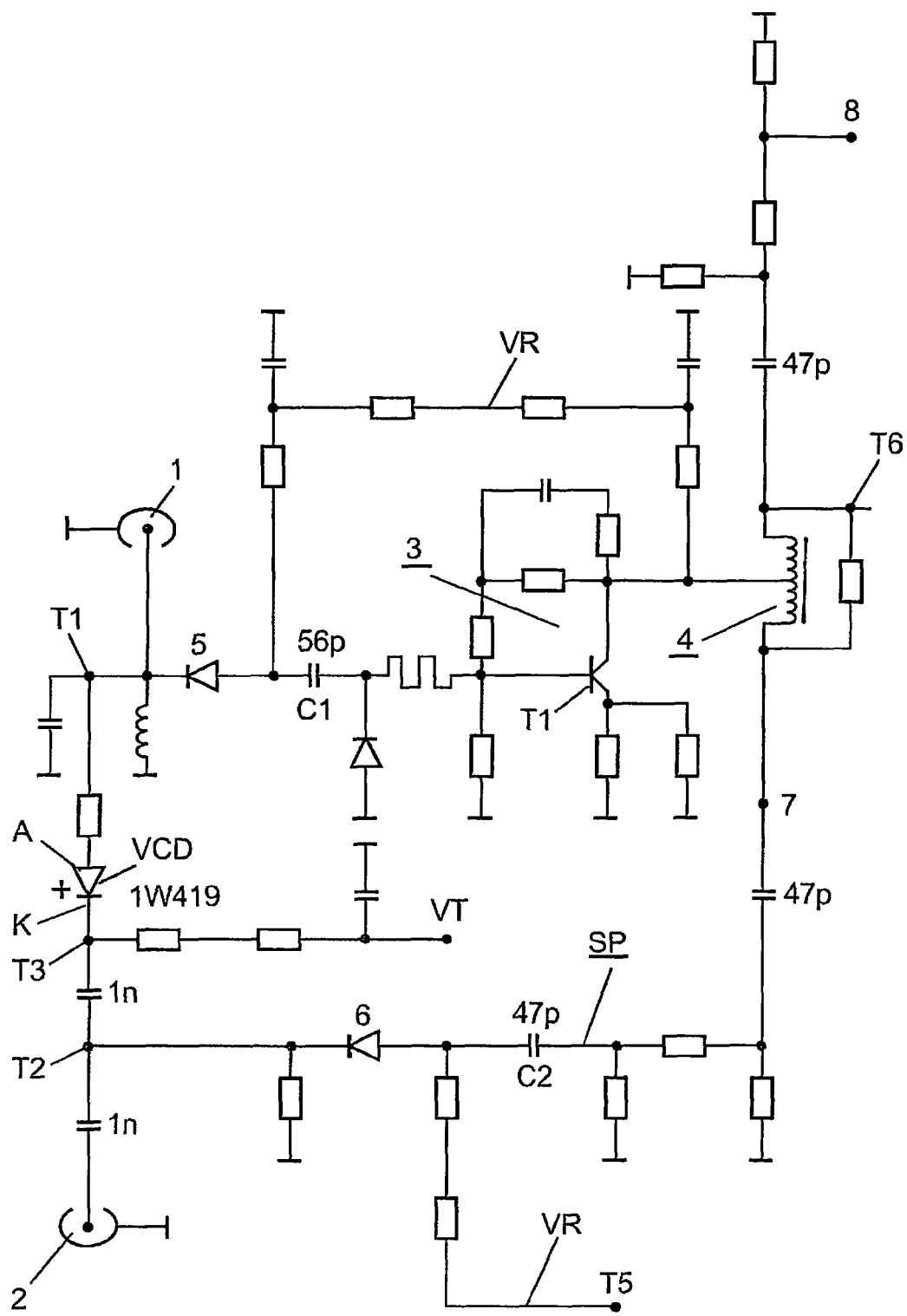

An embodiment for an input stage of a tuner circuit using a variable capacitance diode 1W419 for the passive loop through function is shown in FIG. 6. The varicap VCD is coupled with the anode A to node T1 and HF input 1 and with the cathode K to node T2 coupled with HF output 2. Node T1 is coupled via switching diode 5 to amplifier stage 3 including a single transistor T1 for amplification. The power splitter 4 is implemented by using a coil arrangement and the signal path SP is implemented by using a passive network including resistors and capacitors. The reverse voltage VT for the varicap VCD is applied via node T3 to the cathode K of varicap VCD. The switching voltage VR for the diodes 5, 6 is applied at terminals T5, T6.

Also other embodiments of the invention can be made by a person skilled in the art without departing from the spirit and scope of the present invention. The tuner circuit according to the invention is in particular not limited for a reception of television channels, as described with regard to the embodiments. The invention resides therefore in the claims herein after appended.

The invention claimed is:

1. Tuner circuit comprising a HF input and a HF output with a loop through function, wherein two variable capacitance diodes are arranged in parallel, each of the variable capacitance diode being coupled with a first terminal to the HF input and with a second terminal to the HF output for providing the loop through function, and wherein both variable capacitance diodes are in a passing mode, when no DC voltage is applied.

2. The tuner circuit of claim 1, wherein the two variable capacitance diodes are in a blocking mode for HF input signals, when a DC reverse voltage (VT) is applied to both of the variable capacitance diodes.

3. The tuner circuit of claim 2, wherein for the generation of the DC reverse voltage an already available 33 V supply of the tuner circuit is utilised.

4. The tuner circuit of claim 1, wherein the tuner circuit is designed for reception of television channels.

5. The tuner circuit of claim 4, wherein for the variable capacitance diode at least one tuning variable capacitance diodes is used being designed for satellite tuners with a frequency range of 1-2 GHz.

6. The tuner circuit of claim 5, wherein the tuner circuit is designed for reception of television channels with a frequency range of 48-858 MHz, and wherein the two variable capacitance diodes are tuning variable capacitance diodes, both being designed for the satellite tuners with the frequency range of 1 GHz-2 GHz.

7. The tuner circuit of claim 4, wherein the variable capacitance diodes have a capacitance ratio $C_1/C_{25}>18$ at a frequency of 1 MHz for DC reverse voltages of 1 and 25 Volts.

8. The tuner circuit of claim 4, wherein the variable capacitance diodes have a capacity $C_1>15$ pF, when a DC reverse voltage<1 V is applied, and a capacity $C_{25}<1$ pF, when a DC reverse voltage>25 V is applied.

9. The tuner circuit of claim 1, wherein for the variable capacitance diodes the type 1W419 or RKV552 is used.

10. The tuner circuit of claim 1, comprising a HF amplifier coupled with an input to the HF input, a power splitter coupled with an input to an output of the HF amplifier and coupled with a first output to the HF output for providing an active loop through function, when the tuner circuit is switched-on, and a first diode coupled between a first node and the input of the HF amplifier and a second diode coupled between a second node and the second output of the power splitter, wherein said variable capacitance diodes are arranged as a parallel circuit between the first and second nodes.

11. Tuner circuit comprising a HF input, a variable capacitance diode and a HF output, wherein the variable capacitance diode is coupled with a first terminal to the HF input and with a second terminal to the HF output for providing a loop through function, and as the variable capacitance diode, at least one tuning variable capacitance diode is used being designed for satellite tuners with a frequency range of 1-2 GHz.

12. Tuner circuit according to claim 11, wherein the tuner circuit is designed for reception of television channels with a frequency range of 110-858 MHz, and wherein said variable capacitance diode is included for a passive loop through function.

13. The tuner circuit of claim 12, wherein the variable capacitance diode has a capacitance ratio $C_1/C_{25}>18$ at a frequency of 1 MHz for DC reverse voltages of 1 and 25 Volts.

14. The tuner circuit of claim 12, wherein the variable capacitance diode has a capacity $C_1>15$ pF, when a DC reverse voltage $\leq 1$ V is applied, and a capacity $C_{25}\leq 1$ pF, when a DC reverse voltage >25 V is applied.

* * * * *

UNITED STATES PATENT AND TRADEMARK OFFICE
CERTIFICATE OF CORRECTION

| | |
|---|---|
| PATENT NO. | : 8,519,807 B2 |
| APPLICATION NO. | : 12/452424 |
| DATED | : August 27, 2013 |
| INVENTOR(S) | : Luo et al. |

Page 1 of 1

It is certified that error appears in the above-identified patent and that said Letters Patent is hereby corrected as shown below:

In the Claims

Column 6 - Claim 14:

Line 61 should read: "reverse voltage <1 V is applied, and a capacity $C_{25}$<1"

Signed and Sealed this
Fourth Day of March, 2014

Michelle K. Lee
*Deputy Director of the United States Patent and Trademark Office*